United States Patent
Yui

Patent Number: 5,987,743
Date of Patent: Nov. 23, 1999

[54] AUTOMATIC WIRING DEVICE AND ITS WIRING METHOD

[75] Inventor: Nobuyasu Yui, Tokyo, Japan

[73] Assignee: NEC Corporation, Japan

[21] Appl. No.: 08/847,290

[22] Filed: Apr. 24, 1997

[30] Foreign Application Priority Data

Apr. 25, 1996 [JP] Japan ................................. 8-105245

[51] Int. Cl.⁶ ................................................. H01K 3/10
[52] U.S. Cl. ........................... 29/850; 29/755; 29/857; 29/863
[58] Field of Search ............... 29/755, 850, 825, 29/857

[56] References Cited

U.S. PATENT DOCUMENTS

| | | | |
|---|---|---|---|
| 3,633,096 | 1/1972 | Bollman | 29/755 |
| 3,693,228 | 9/1972 | Logan | 29/755 X |
| 3,842,496 | 10/1974 | Mercer | 29/755 |
| 4,348,805 | 9/1982 | Gibbons | 29/863 X |
| 4,627,162 | 12/1986 | Holt | 29/850 X |
| 4,711,025 | 12/1987 | DeSanto | 29/755 X |
| 4,724,612 | 2/1988 | Pearson | 29/850 |
| 5,083,369 | 1/1992 | Cerda | 29/857 |
| 5,355,581 | 10/1994 | Sorlano | 29/857 |
| 5,483,459 | 1/1996 | Tamura | 29/755 X |

FOREIGN PATENT DOCUMENTS

| | | |
|---|---|---|
| 1-225335 | 9/1989 | Japan . |
| 2-61772 | 3/1990 | Japan . |
| 4-236671 | 8/1992 | Japan . |
| 6-77322 | 3/1994 | Japan . |
| 6-124321 | 5/1994 | Japan . |
| 6-236924 | 8/1994 | Japan . |
| 7-48221 | 5/1995 | Japan . |

*Primary Examiner*—Carl J. Arbes
*Attorney, Agent, or Firm*—Ostrolenk, Faber, Gerb & Soffen, LLP

[57] ABSTRACT

An automatic wiring device comprises an initial wiring unit for performing initial wiring processing on the coordinate plane surface for wiring arrangement to be processed, a short cost value setting unit for setting a cost value on each unit cell arranged on the coordinate plane surface for wiring arrangement in such a way that the cost value of the unit cell on the connected wiring in the vicinity of the terminals of the connected wiring is set larger than the cost values of any other unit cells when there remains a terminal pair unconnected in the wiring processing by the initial wiring unit, and a peeling and rewiring unit for performing wiring processing by the cost-attached labyrinth method, using the set cost values, and if peeling off another wiring in the above wiring processing, performing rewiring processing for connecting a terminal pair getting unconnected owing to the wiring being peeled off.

13 Claims, 10 Drawing Sheets

(A)

(B)

(C)

(D)

(A)

(B)

(C)

(D)

(A) (B)

(A) (B)

(A)

(B)

(C)

(D)

AUTOMATIC WIRING DEVICE AND ITS WIRING METHOD

BACKGROUNDS OF THE INVENTION

1. Field of the Invention

The present invention relates to an automatic wiring device and an automatic wiring method carried out by the device for use in a pattern design on an integrated circuit or a printed wiring board, and more particularly to an automatic wiring device and its automatic wiring method capable of obtaining a wiring route by peeling off another wiring in case of necessity, when performing wiring processing on the terminals remaining unconnected through the initial wiring processing.

2. Description of the Related Art

When performing a pattern design on an integrated circuit or a printed wiring board by the use of a computer system such as a CAD system or the like, circuit elements are arranged on the coordinate plane surface for wiring arrangement of pattern at first, and then a wiring route for connecting terminals that are input/output points of each circuit element is searched for, then to carry out wiring.

The wiring processing of the conventional pattern design technique of this kind has been performed as follows. As illustrated in FIG. 8, the rectangle of a wiring surface 801 is divided into unit cells at first. A given value (hereinafter, referred to as a cost value) is set in each unit cell. A cost value is uniformly set in every unit cell. In the example of FIG. 8, the cost value of each unit cell is defined as "1" uniformly.

Next, in a pair of terminals to be connected, a wiring route is obtained by the locus starting from a terminal and stepping every unit cell intervening between the terminals to the end of the other terminal. At this time, the cost value of each unit cell on the wiring route is accumulated. When there exist a plurality of wiring routes with respect to a given pair of terminals, a wiring route having the minimum accumulated cost value is determined as the wiring route of this pair. This searching method of a wiring route is called as a cost-attached labyrinth method.

If there has been another wiring connected already when acquiring a wiring route with respect to the given terminal pair, the wiring becomes an obstacle to the wiring route to be acquired. More specifically, a cost value will not be set in the unit cell through which the wiring is going, so that this unit cell cannot be selected as a through point of the wiring route.

FIG. 8 shows an example in the case of connecting the terminals "S" and "S" while detouring around the obstacle, the terminals "T" and "T", and the wiring "T-T" therebetween. In FIG. 8(A), the accumulated value of each cost value on the wiring route connecting the terminals "S" and "S" is attached to each unit cell except for the unit cell through which the wiring "T-T" connecting the terminals "T" and "T" is going. The minimum accumulated cost value on the wiring route between the terminals "S" and "S" is "10" as shown in FIG. 8. Therefore, the route "L10" indicated in FIG. 8(B) is determined as the wiring route between the terminals "S" and "S".

Wiring processing is actually performed along thus-determined wiring route, to connect the terminal pair.

No problem arises when all the terminal pairs can be connected by detouring around an obstacle as mentioned above, in the initial wiring processing. However, when there remains a terminal pair unconnected in the initial wiring processing and there exists no route capable of detouring around all the obstacles with respect to the same terminal pair, a wiring route to connect the terminal pair will cross another wiring to cause a short circuit. In this case, a wiring route is searched for, with the cost value set on the unit cell where another wiring is going through. The wiring crossed by the wiring route is peeled off in order to perform wiring processing on this wiring route. As a result, since the terminal pair turns into unconnected state, wiring processing will be again on this terminal pair after completion of the performing wiring processing.

FIG. 9 is a flow chart showing an operation of connecting the terminal pair that failed to be connected in the initial wiring processing.

Referring to FIG. 9, after necessary initial setting is done (Step 901), wiring processing is performed in accordance with the design rule, in other words, in a way such as to prevent from the crossing of the wiring routes to cause a short circuit (Step 902). At this time, a terminal pair having no routes capable of detouring around all the obstacles is left behind as an unconnected terminal pair.

It is judged whether the wiring has been completed on all the terminal pairs (Step 903). When there remains an unconnected terminal pair, one terminal of the unconnected terminal pair is selected as a candidate for processing (Step 904), and a cost value is set on every unit cell in the wiring permitted area, including the unit cells through which another connected wiring is going (Step 905).

Next, a wiring route connecting the terminal pair is searched for, regardless of the design rule, in other words, in a way such as to permit a short circuit to another wiring, and the wiring processing is performed along the obtained wiring route (Step 906). The other wiring crossed by the wiring route is peeled off at this time.

Rewiring processing for connecting the terminal pair is performed (Step 907), as for a terminal pair which had been connected by the wiring peeled off in Step 906. At this time, if there exists a wiring route capable of connecting the terminal pair by detouring around an obstacle, the wiring processing will be performed along this wiring route. If there exists no wiring route as mentioned above, the wiring processing from Step 904 to Step 907 will be repeated to the terminal pair as an unconnected terminal pair, like other unconnected terminal pairs.

FIG. 10 is a view for use in describing the wiring processing according to the above conventional automatic wiring method. As illustrated in FIG. 10(A), there exist the terminal pairs to be connected, "S, S" and "T, T", on the coordinate plane surface for wiring arrangement. Any wiring route should be determined in a way such as to prevent from the crossing of routes to cause a short circuit. In other words, any wiring route doesn't have a unit cell in common.

As illustrated in FIG. 10(B), assuming that the terminal pair "S, S" is connected with each other, the terminal pair "T, T" cannot be connected with each other without crossing the wiring "S-S" connecting the terminal pair "S, S" and shorting the same. Therefore, the terminal pair "T, T" remains unconnected, so that the wiring processing is performed on it from Step 904 and the later mentioned above. In other words, the wiring route "T-T" is determined with the short circuit permitted to the wiring "S-S", and the wiring processing is performed along the wiring route "T-T" after peeling off the wiring "S-S", as illustrated in FIG. 10(C). The wiring processing is performed on the terminal pair "S, S" again along the wiring route "S-S" capable of detouring around the wiring "T-T", as illustrated in FIG. 10(D).

However, the above-mentioned conventional automatic wiring method, in which a cost value is uniformly set in every unit cell in the wiring processing of the terminal pair remaining unconnected in the initial wiring processing, considers none of the difficulty in the rewiring processing of the wiring peeled off when another wiring must be peeled off. Therefore, when the wiring processing is performed on the terminal pair whose wiring was peeled off, it may happen that another wiring must be peeled off again. Since a terminal in the vicinity of the wiring prohibited area is under restriction as to the direction in which wiring can be extended, it is better to prevent from drawing a wiring route in the vicinity of a terminal. However, since there is no difference among the cost values, it may happen that a wiring route is set in the vicinity of a terminal as follows.

For example, when a wiring route running in the longitudinal direction is set on the coordinate plane surface for wiring arrangement as shown in FIG. 11, either the wiring "L11" or "L12" must be peeled off. In FIG. 11, the unit cells indicated by the oblique lines are wiring prohibited areas. There is, however, a possibility of setting the wiring route "L13" after peeling off the wiring "L11" as shown in FIG. 11(B), because of no difference among each cost value. In this case, the wiring "L13" must be peeled off in order to rewire the terminal "P5", which is a useless processing.

When a wiring route running in the longitudinal direction is set on the coordinate plane surface for wiring arrangement as shown in FIG. 12, the wiring route should cross the wiring "L14" somewhere inevitably. In FIG. 12, the unit cells indicated by oblique lines are wiring prohibited areas. However, there is a possibility of setting the wiring route "L15" passing through the unit cell adjacent to the terminal "P6" as illustrated in FIG. 12(B). In this case, the wiring "L15" must be peeled off in order to rewire the terminal "P6", which is a useless processing.

As mentioned above, when another wiring is peeled off in order to perform the wiring processing on the terminal pair remaining unconnected in the initial wiring processing, further another wiring may be peeled off again in some cases, in order to perform the rewiring processing on the terminal pair getting unconnected owing to the wiring thereof being peeled off, which is defective in efficiency.

Further, it may happen that the wiring processing in accordance with the design rule cannot be completed, because of circulating like a loop between the step of obtaining wiring by a certain wiring processing and the step of peeling off another wiring by the same wiring processing.

For example, on the coordinate plane surface for wiring arrangement as shown in FIG. 13, if the wiring route connecting the unconnected terminal pair "B, B" is drawn like the wiring route "B-B" as shown in FIG. 13(B), with the terminal pair "A, A" connected with each other in the initial wiring processing as shown in FIG. 13(A), the wiring "A-A" must be peeled off in order to carry out the wiring processing along the wiring route "B-B", as shown in FIG. 13(C). This time, if the wiring route connecting the terminal pair "A, A" getting unconnected, owing to the wiring "A-A" being peeled off, is drawn again like the wiring route "A-A" as shown in FIG. 13(D), the wiring "B-B" must be peeled off again, in order to carry out the wiring processing along this wiring route "A-A", as shown in FIG. 13(A). Thus, the wiring processing will circulate from FIG. 13(A) to FIG. 13(D) forever, without being completed.

This kind of the conventional automatic wiring method is disclosed in, for example, Japanese Patent Publication Laid-Open (Kokai) No. Heisei 2-61772 "Automatic Wiring Device", No. Heisei 4-236671 "Automatic Peeling and Rewiring Method", and Japanese Patent Publication Laid-Open (Kokai) No. Heisei 7-48221 "Route Searching Method".

The automatic wiring device disclosed in Japanese Patent Publication Laid-Open (Kokai) No. Heisei 2-61772 "Automatic Wiring Device" comprises a means for extracting an obstacle between the starting point to the end point of wiring that would be unconnected in the initial wiring processing and judging whether the obstacle is removable or not, a means for computing an index for estimating whether it is possible or not to connect the unconnected position by removing a certain segment of the wiring forming the obstacle, as for each segment of the connected wiring forming the obstacle, a means for creating a combination of the segments thereof to be removed, with the removing priority attached there, a means for deleting the relevant segments, and a means for saving the deleted route.

The automatic wiring method disclosed in Japanese Patent Publication Laid-Open (Kokai) No. Heisei 4-236671 "Automatic Peeling and Rewiring Method" comprises a step of extending each searching route from a terminal pair to be connected with each other to detect another wiring that may be an obstacle, a step of continuously extending the searching route indifferently to another wiring being shorted by the searching route, a step of establishing the extended searching route as a wiring route for connecting the terminal pair and peeling off another wiring that is an obstacle, and a step of rewiring another wiring turning unconnected by being peeled off.

The automatic wiring method disclosed in Japanese Patent Publication Laid-Open (Kokai) No. Heisei 7-48221 "Route Searching Method" comprises a means for attaching each label value, in a way of increasing by one in an ascending order, to each unit cell on a route connecting one terminal to the other terminal, a means for accumulating a label value obtained by adding a first increment value to the above-mentioned label value, as a label value of the route, if the above route comes across another connected route on a certain unit cell, and accumulating a label value obtained by adding a second increment value to the above-mentioned label value, as a label value of the route, if the route comes across none of the unconnected routes, and a means for establishing a route where the total of each label value is minimum, as a wiring route for the terminal pair. Each means repeats the above processing until a predetermined wiring route setting state is set while increasing the first and second increment values by the label value accumulating means.

In the above-mentioned conventional automatic wiring technique, however, manual operation is obliged to decide a wiring route, when the processing of peeling the connected wiring is repeated in order to do the wiring processing for a terminal pair unconnected in the initial wiring processing, thereby deteriorating the efficiency in the wiring processing.

SUMMARY OF THE INVENTION

In order to solve the above conventional problem, it is an object of the present invention to provide an automatic wiring device and automatic wiring method capable of improving efficiency in the automatic wiring processing, by decreasing the case of failing to do wiring because of complication in the vicinity of the terminals, in rewiring processing after peeling off a connected wiring shorted.

It is another object of the present invention to provide an automatic wiring device and automatic wiring method capable of preventing the situation that the wiring processing according to the design rule cannot be performed owing to circulating like a loop between the step of obtaining wiring by a given wiring processing and the step of peeling off another wiring by the same wiring processing, thanks to the decrease of the failing case in the wiring because of complication in the vicinity of the terminals.

According to the first aspect of the invention, an automatic wiring device for use in a pattern design of an integrated circuit or a printed wiring board, for performing wiring processing between terminals that are circuit elements, according to the pattern on a coordinate plane surface for wiring arrangement with the circuit elements arranged thereon, comprises an initial wiring means for performing initial wiring processing, on the coordinate plane surface for wiring arrangement to be processed, without permitting any wiring to be shorted, a short cost value setting means for setting a cost value on each unit cell arranged on the coordinate plane surface for wiring arrangement, on the basis of a predetermined rule, when there remains a terminal pair unconnected in the wiring processing by the initial wiring means, a peeling and rewiring means for deciding a wiring route by the cost-attached labyrinth method, using the cost values set by the short cost value setting means, so as to perform wiring processing along the wiring route while peeling off another wiring in case of necessity, and if peeling off another wiring in the above wiring processing, performing rewiring processing for connecting a terminal pair getting unconnected owing to the wiring being peeled off, wherein the short cost value setting means sets a cost value on every unit cell including the unit cells through which a connected wiring is going, excepting the unit cells on a given wiring prohibited area, in such a way that the cost value of the unit cell on the connected wiring in the vicinity of the terminals of the connected wiring is set larger than the cost values of any other unit cells.

In the preferred construction, the short cost setting means sets a cost value on each unit cell on a connected wiring in such a way that the largest cost value is set on the unit cell adjacent to a terminal of the connected wiring and that the cost value of the unit cell becomes smaller according as the unit cell is further away from the terminal, and sets on the other unit cells, the minimum of the cost values set on the above unit cells on the connected wiring or the smaller cost value.

In the preferred construction, the short cost setting means sets a cost value on each unit cell on a connected wiring in such a way that the largest cost value is set on the unit cell adjacent to a terminal of the connected wiring, the cost value of the unit cell becomes smaller according as the unit cell is further away from the terminal, and that the gradient between the cost values of the unit cells becomes sharper according as the unit cell is nearer to the terminal, and sets on the other unit cells, the minimum of the cost values set on the above unit cells on the connected wiring or the smaller cost value.

In the preferred construction, the short cost setting means sets a cost value on each unit cell on a connected wiring in such a way that the largest cost value is set on the unit cell adjacent to a terminal of the connected wiring and that the cost value of the unit cell becomes smaller according as the unit cell is further away from the terminal, when the degree of freedom on the possible direction to draw wiring from the terminal is restricted, multiplies the cost value of each unit cell on the connected wiring by a predetermined number so as to make the cost value larger according as the restriction becomes severer, and sets on the other unit cells, the minimum of the cost values set on the above unit cells on the connected wiring or the smaller cost value.

In another preferred construction, the short cost setting means sets a cost value on each unit cell on a connected wiring in such a way that the largest cost value is set on the unit cell adjacent to a terminal of the connected wiring and that the cost value of the unit cell becomes smaller according as the unit cell is further away from the terminal, when the degree of freedom on the possible direction to draw wiring from the terminal is restricted, multiplies the cost value of each unit cell on the connected wiring by the number of "1" larger than the restricted number from all originally possible direction to draw wiring, and sets on the other unit cells, the minimum of the cost values set on the above unit cells on the connected wiring or the smaller cost value.

In another preferred construction, the peeling and rewiring means accumulates each cost value set by the short cost value setting means, as for each unit cell existing on a route from one terminal to the other terminal of a terminal pair to be connected, and when there exist a plurality of routes, decides a route having the minimum accumulated value as a wiring route for the terminal pair, by comparison among the accumulated cost value of each route, carries out wiring processing along the wiring route decided above, while peeling off another wiring that would be shorted by the wiring route, in the wiring processing, and as for a terminal pair getting unconnected by the wiring being peeled off, performs rewiring processing along the wiring route, as far as there exists a wiring route capable of detouring all the obstacles.

According to the second aspect of the invention, an automatic wiring method for performing wiring processing between terminals that are circuit elements, according to the pattern on a coordinate plane surface for wiring arrangement with the circuit elements arranged thereon, in the wiring processing of a pattern design on an integrated circuit or a printed wiring board, comprising the steps of:

a first step of performing initial wiring processing, on the coordinate plane surface for wiring arrangement to be processed, without permitting any wiring to be shorted, a second step of, when there remains a terminal pair unconnected in the wiring processing by the first step, setting a cost value on every unit cell including the unit cells through which a connected wiring is going, excepting the unit cells on a given wiring prohibited area, of all the unit cells set on the coordinate plane surface for wiring arrangement, according to a predetermined rule that the cost value of the unit cell on the connected wiring in the vicinity of the terminals of the connected wiring is set larger than the cost values of any other unit cells, and a third step of deciding a wiring route by the cost-attached labyrinth method, using the cost values set by the second step, so as to perform wiring processing along the wiring route while peeling off another wiring in case of necessity, and if peeling off another wiring in the above wiring processing, performing rewiring processing for connecting a terminal pair getting unconnected owing to the wiring being peeled off.

In the preferred construction, the second step of setting a cost value on each unit cell includes a step of setting a cost value on each unit cell on a connected wiring in such a way that the largest cost value is set on the unit cell adjacent to a terminal of the connected wiring and that the cost value of the unit cell becomes smaller according as the unit cell is further away from the terminal, and setting on the other unit cells, the minimum of the cost values set on the above unit cells on the connected wiring or the smaller cost value, and a step of, when the degree of freedom on the possible direction to draw wiring from the terminal is restricted, multiplying the cost value of each unit cell on the connected wiring by a predetermined number so as to make the cost value larger according as the restriction becomes severer.

In the preferred construction, the third step of peeling off another wiring so to perform wiring processing includes a step of accumulating each cost value set by the second step, as for each unit cell existing on a route from one terminal to the other terminal of a terminal pair to be connected, and when there exist a plurality of routes, deciding a route having the minimum accumulated value as a wiring route for the terminal pair, by comparison among the accumulated cost value of each route, a step of carrying out wiring processing along the wiring route decided above, while peeling off another wiring that would be shorted by the wiring route, in the wiring processing, and a step of, as for a terminal pair getting unconnected by the wiring being peeled off, performing rewiring processing along the wiring route, as far as there exists a wiring route capable of detouring all the obstacles.

In the above-mentioned construction, the second step of setting a cost value on each unit cell includes a step of setting a cost value on each unit cell on a connected wiring in such a way that the largest cost value is set on the unit cell adjacent to a terminal of the connected wiring and that the cost value of the unit cell becomes smaller according as the unit cell is further away from the terminal, and setting on the other unit cells, the minimum of the cost values set on the above unit cells on the connected wiring or the smaller cost value, and a step of, when the degree of freedom on the possible direction to draw wiring from the terminal is restricted, multiplying the cost value of each unit cell on the connected wiring by a predetermined number so as to make the cost value larger according as the restriction becomes severer, while the third step of peeling off another wiring so to perform wiring processing includes a step of accumulating each cost value set by the second step, as for each unit cell existing on a route from one terminal to the other terminal of a terminal pair to be connected, and when there exist a plurality of routes, deciding a route having the minimum accumulated value as a wiring route for the terminal pair, by comparison among the accumulated cost value of each route, a step of carrying out wiring processing along the wiring route decided above, while peeling off another wiring that would be shorted by the wiring route, in the wiring processing, and a step of, as for a terminal pair getting unconnected by the wiring being peeled off, performing rewiring processing along the wiring route, as far as there exists a wiring route capable of detouring all the obstacles.

According to the third aspect of the invention, a COMPUTER READABLE MEMORY storing a computer program controlling an automatic wiring device realized by a computer system, for use in a pattern design of an integrated circuit or a printed wiring board, for performing wiring processing between terminals that are circuit element according to the pattern on a coordinate plane surface for wiring arrangement with the circuit elements arranged thereon, the computer program comprises a first step of performing initial wiring processing, on the coordinate plane surface for wiring arrangement to be processed, without permitting any wiring to be shorted, a second step of, when there remains a terminal pair unconnected in the wiring processing by the first step, setting a cost value on every unit cell including the unit cells through which a connected wiring is going, excepting the unit cells on a given wiring prohibited area, of all the unit cells set on the coordinate plane surface for wiring arrangement, according to a predetermined rule that the cost value of the unit cell on the connected wiring in the vicinity of the terminals of the connected wiring is set larger than the cost values of any other unit cells, and a third step of deciding a wiring route by the cost-attached labyrinth method, using the cost value set by the second step, so as to perform wiring processing along the wiring route while peeling off another wiring in case of necessity, and if peeling off another wiring in the above wiring processing, performing rewiring processing for connecting a terminal pair getting unconnected owing to the wiring being peeled off.

In the preferred construction, the second step of setting a cost value on each unit cell includes a step of setting a cost value on each unit cell on a connected wiring in such a way that the largest cost value is set on the unit cell adjacent to a terminal of the connected wiring and that the cost value of the unit cell becomes smaller according as the unit cell is further away from the terminal, and setting on the other unit cells, the minimum of the cost values set on the above unit cells on the connected wiring or the smaller cost value, and a step of, when the degree of freedom on the possible direction to draw wiring from the terminal is restricted, multiplying the cost value of each unit cell on the connected wiring by a predetermined number so as to make the cost value larger according as the restriction becomes severer, while the third step of peeling off another wiring so to perform wiring processing includes a step of accumulating each cost value set by the second step, as for each unit cell existing on a route from one terminal to the other terminal of a terminal pair to be connected, and when there exist a plurality of routes, deciding a route having the minimum accumulated value as a wiring route for the terminal pair, by comparison among the accumulated cost value of each route, a step of carrying out wiring processing along the wiring route decided above, while peeling off another wiring that would be shorted by the wiring route, in the wiring processing, and a step of, as for a terminal pair getting unconnected by the wiring being peeled off, performing rewiring processing along the wiring route, as far as there exists a wiring route capable of detouring all the obstacles.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
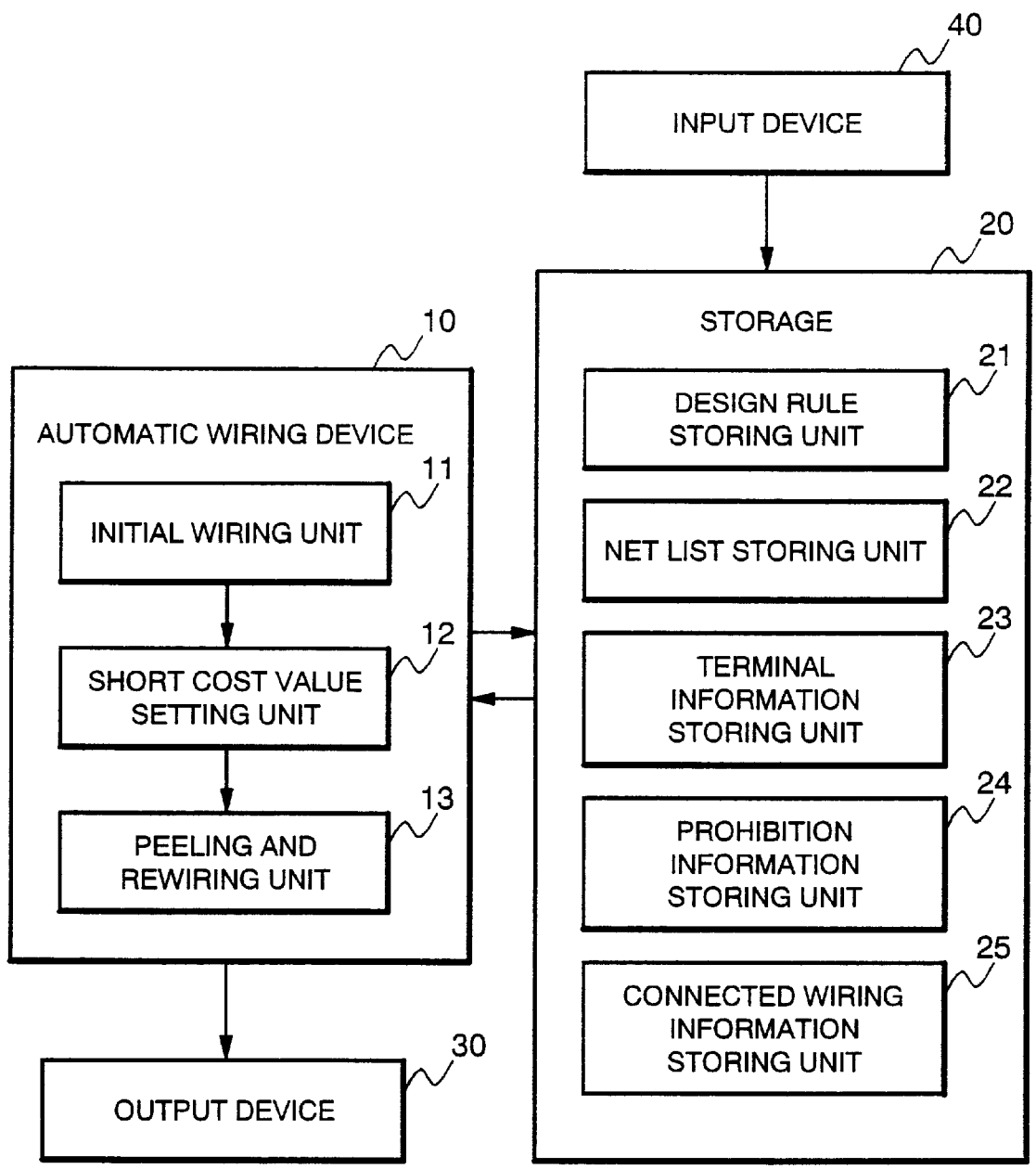
FIG. 1 is a block diagram showing a constitution of an automatic wiring device according to an embodiment of the present invention.
Figure 2:
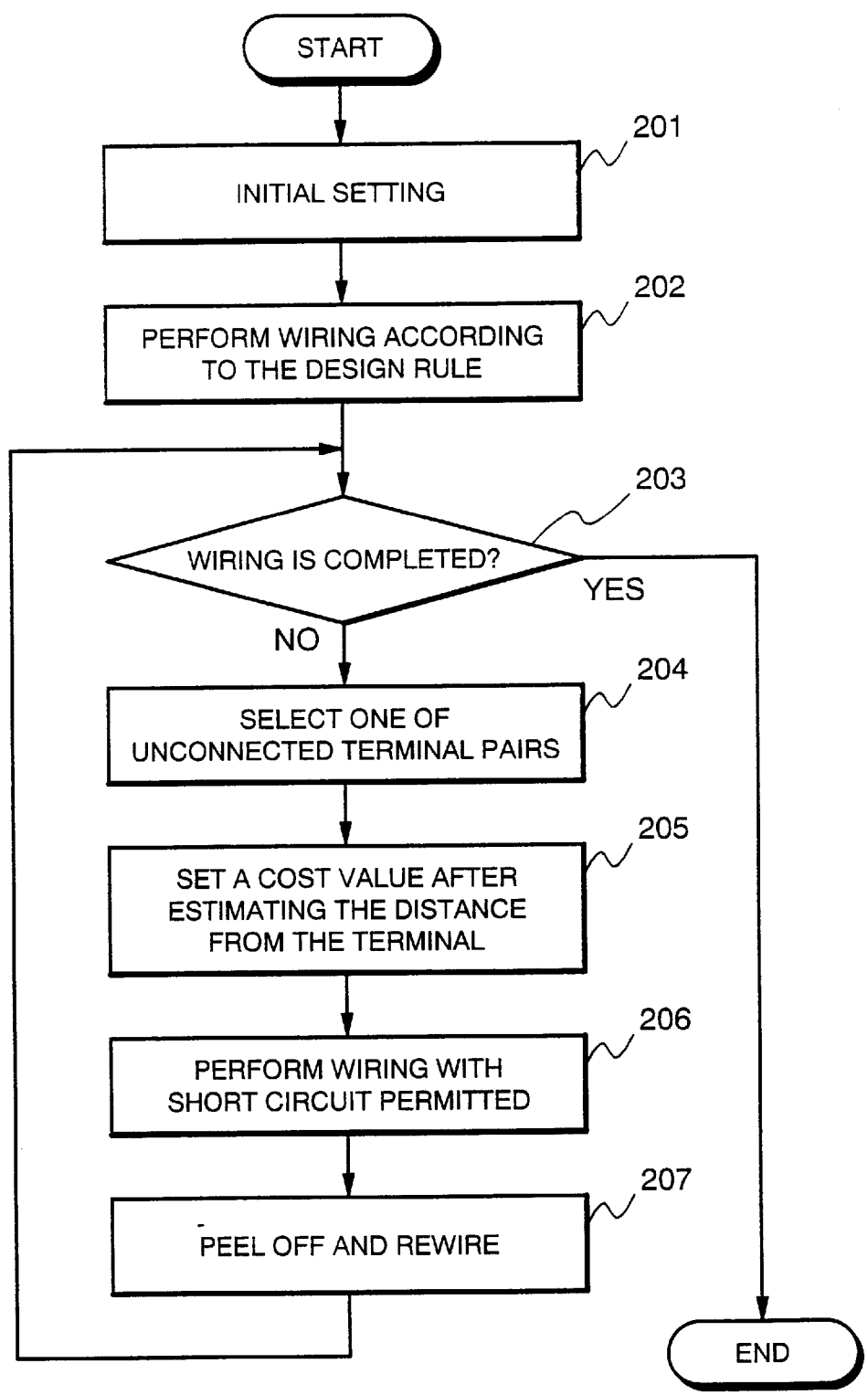
FIG. 2 is a flow chart showing an operation of an automatic wiring method according to the embodiment.
Figure 3:
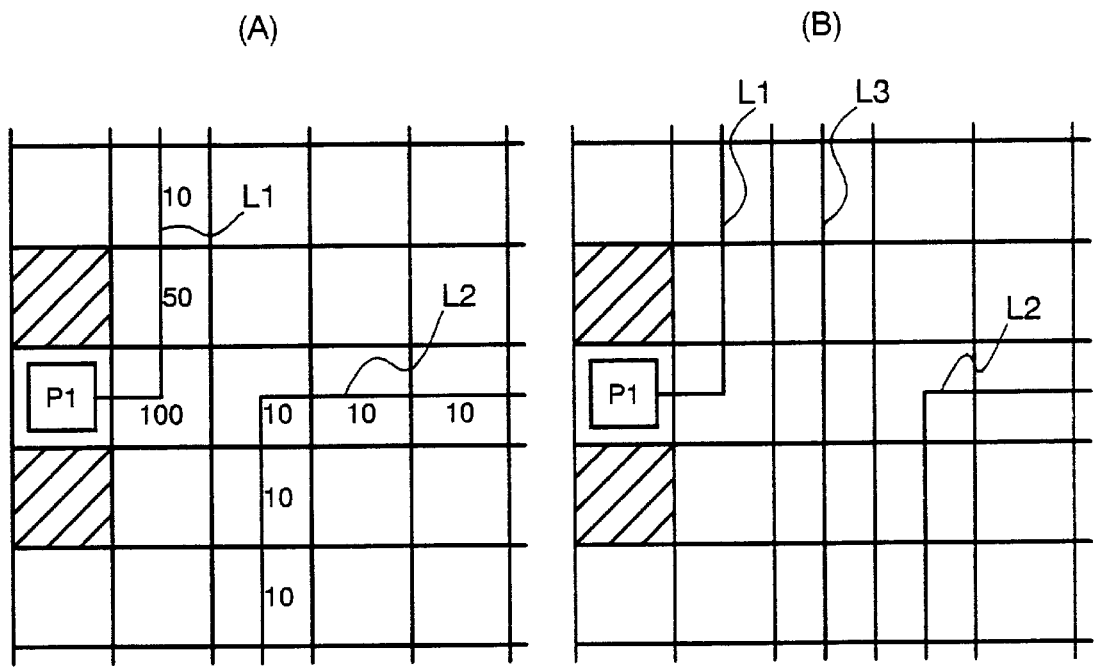
FIG. 3 shows a layout for use in describing an example of a setting way of a cost value and wiring processing according to the embodiment.
Figure 4:
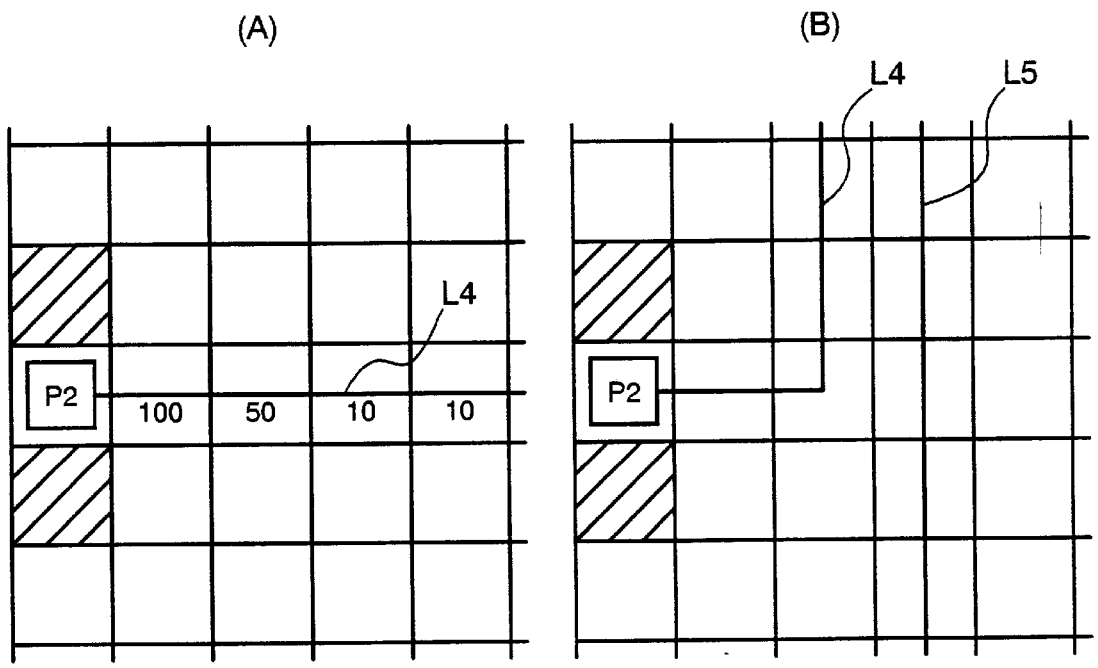
FIG. 4 shows a layout for use in describing another example of a setting way of a cost value and wiring processing according to the embodiment.
Figure 5:
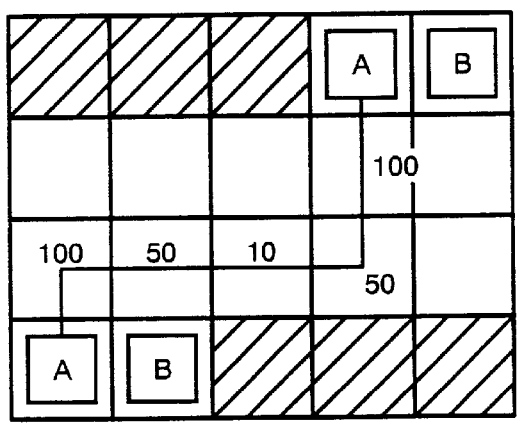
FIG. 5 shows a layout for use in describing further another example of a setting way of a cost value and wiring processing according to the embodiment.
Figure 5:
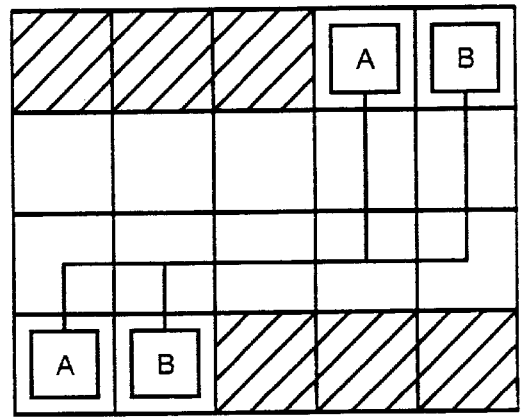
Figure 5:
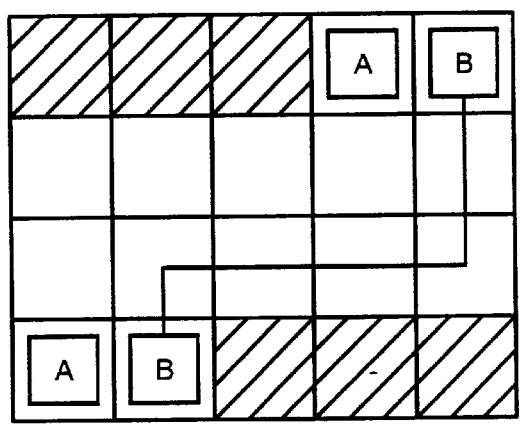
Figure 5:
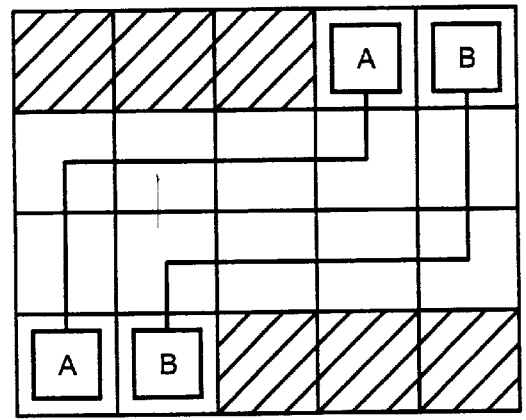

FIG. 1 is a block diagram showing a constitution of an automatic wiring device according to an embodiment of the present invention. FIG. 2 is a flow chart showing an operation of wiring processing according to the automatic wiring device of the embodiment. FIGS. 3 to 5 are layout views for use in describing the wiring process from search for a wiring route to be connected by the use of the cost-attached labyrinth method to decision of the wiring route.

As illustrated in FIG. 1, the automatic wiring device 10 of the embodiment comprises an initial wiring unit 11 for performing initial wiring processing, on the coordinate plane surface for wiring arrangement, where the pattern design is to be performed, a short cost value setting unit 12 for connecting the terminal pair when there remains an unconnected terminal pair in the initial wiring processing by the initial wiring unit 11, and a peeling and rewiring unit 13. The automatic wiring device 10 is connected with a storage 20 storing various information regarding the coordinate plane surface for wiring arrangement which is a subject of the pattern design and the other information such as a design rule for performing the wiring processing and the like, and connected with an output device 30 for supplying the result of the wiring processing. The storage 20 is connected with an input device 40 for receiving the above-mentioned various data. The storage 20 includes a design rule storing unit 21 for storing a general design rule as well as a particular design rule of the embodiment for performing the wiring processing on the plane surface for wiring arrangement, a net list storing unit 22 for storing a list of wiring to be processed, a terminal information storing unit 23 for storing the information on the position of a terminal and the like, a prohibition information storing unit 24 for storing the information on the wiring prohibited area on the plane surface for wiring arrangement, and a connected wiring information storing unit 25 for storing the information on the wiring where the processing has been already completed. FIG. 1 shows only the particular components of the embodiment, while other general components are omitted therefrom.

The automatic wiring device 10 of the embodiment is realized by the use of a computer system such as a work station or the like. Each component thereof is realized by, for example, a memory such as a RAM or the like and a CPU controlled by a computer program stored in the storage 20. The computer program for controlling each component is stored in a storing medium such as a magnetic disk, a semiconductor memory, or the like.

Of the above components, the initial wiring unit 10 performs initial wiring processing, on the coordinate plane surface for wiring a pattern on an integrated circuit or a printed wiring board which is a candidate for processing, according to the general design rule. Therefore, the initial wiring unit 10 includes a means for dividing the coordinate plane surface for wiring arrangement into cells, to set each cost value there and deciding a wiring route with use of the cost-attached labyrinth method to carry out the wiring processing, although it is not illustrated in the drawing. The procedure of the wiring processing by the initial wiring unit 10 is similar to that of the conventional initial wiring processing. The wiring established on the coordinate plane surface for wiring arrangement as the result of the wiring processing by the initial wiring unit 10, never shorts another wiring by crossing or overlapping the wiring.

The short cost value setting unit 12 sets a cost value for connecting the terminal pair when there remains a terminal pair unconnected in the initial wiring processing by the initial wiring unit 10. Each cost value is also set on unit cells through which the connected wiring is going. This enables the system to search for a wiring route for an unconnected terminal pair, regardless of the design rule, with a short circuit permitted to the connected wiring.

Priority is attached to each cost value to be set by the short cost value setting unit 12, on the basis of a given rule. In this embodiment, such a method is adopted as to decide the value according to the distance from the terminal where the wiring processing has been completed, in the wiring route where the wiring processing has been completed. More specifically, as the cost value, a large value is set on a unit cell in the vicinity of the terminal where the wiring processing has been completed, and the smaller value is set on a unit cell according as it is further away from the terminal. Owing to this, when accumulating each cost value of the unit cells, on the wiring route between the terminals to be connected with each other, the accumulated cost value becomes larger on the wiring route going through the vicinity of the terminal where the wiring processing has been completed.

The peeling and rewiring unit 13 decides a wiring route of a terminal pair to be connected with each other so to carry out the wiring processing by the use of the cost value established by the short cost value setting unit 12 when there remains an unconnected terminal pair in the initial wiring processing by the initial wiring unit 10. A method of deciding a wiring route is the cost-attached labyrinth method. When there exist a plurality of wiring routes for connecting a terminal pair to be processed, the wiring route having the minimum cost value is to be decided as a wiring route for this terminal pair. Since the decided wiring route necessarily shorts the other wiring in the wiring processing by the peeling and rewiring unit 13, the shorted connected wiring is peeled off in this wiring processing. As far as there exists a wiring route in accordance with the design rule, in other words, a wiring route shorting no wiring, rewiring processing will be performed along a wiring route for a terminal pair getting unconnected as the result of the wiring being peeled off.

As mentioned above, the short cost value setting unit 12 sets a cost value for each unit cell through which a connected wiring is going, with priority assigned to the unit cell depending on its distance from the terminal. Therefore, a wiring route to be decided by the peeling and rewiring unit 13, if shorting another connected wiring, is provided at the position appropriately distant from the terminals to be connected together by the connected wiring.

This time, an operation of the embodiment will be described with reference to the flow chart of FIG. 2.

At first, necessary initial setting is performed on the coordinate plane surface for wiring arrangement that is a candidate for a pattern design, as the initial wiring processing by the initial wiring unit 10 (Step 201). For example, setting of a unit cell and a wiring prohibited area, arrangement of circuit elements, setting of a terminal or the like, are involved. The initial wiring processing is performed according to the general design rule including wiring processing execution order for every terminal pair and setting of a wiring route capable of detouring the wiring prohibited area (Step 202).

Next, it is judged whether the wiring processing has been completed for all the terminal pairs (Step 203). If all the wiring processing has been completed, the operation is terminated. While, when there remains an unconnected terminal pair, in other words, such a terminal pair as has no wiring route capable of detouring all the other wiring, failing to be connected with each other in the initial wiring processing, Step 203 goes to the wiring processing by the short cost value setting unit 12 and the peeling and rewiring unit 13. At first, the short cost value setting unit 12 selects a pair of terminals to be connected with each other (Step 204), and sets a cost value on each unit cell on the coordinate plane surface for wiring arrangement according to a predetermined rule for priority assignment (Step 205). As the rule for priority assignment, such a method is adopted here as to decide the cost value depending on the distance from the terminal where the wiring processing has been completed, while paying attention to the wiring which has been connected.

The peeling and rewiring unit 13 searches for a wiring route, regardless of the design rule, in other words, allowing it to short the other wiring, so to carry out the wiring processing along the obtained wiring route (Step 206). The other wiring shorted by this wiring route is peeled off.

Rewiring processing is performed (Step 207) for connecting the terminal pair which was connected together by the route peeled off in Step 206. If there exists a wiring route capable of connecting the terminal pair while detouring an obstacle, the rewiring processing is performed along this wiring route. If there exists no wiring route as above, the terminal pair is regarded as an unconnected terminal pair and the wiring processing from Steps 204 to 207 is performed on it, similarly to other unconnected terminal pairs.

More detailed description will be made with reference to the layout views of FIGS. 3 and 4. In the cost value setting processing by the short cost value setting unit 12 in Step 205, the cost value of the unit cell adjacent to the terminal is defined as "100", the cost value of the second unit cell from the terminal is defined as "50", and the cost value of the other unit cells is uniformly defined as "10". Although this figure shows the cost values only on the unit cells through which the wiring is going, each cost value of the other unit cells, except for the terminal and the oblique lines-attached wiring prohibited area, is also regarded as "10".

Any value can be used as the cost value to be set on each unit cell, as far as it follows a rule that the larger value should be set on the unit cell nearer to the terminal where the wiring processing has been completed. The gradient of the set values is preferably made sharper at the position nearer to the terminal, in order to prevent another wiring route from passing in the vicinity of the terminal. Really, it shall be decided by feeding back the result of the actual pattern design.

FIGS. 3(A) and (B) show the way to decide which wiring to be peeled off when peeling off one of several wiring in order to do the wiring processing.

With respect to the terminal "P1", in FIG. 3(A), the cost value of the first unit cell adjacent to the terminal "P1", of the unit cells through which the connected wiring "L1" linking the terminal "P1" to the other one is going, is defined as "100", the cost value of the second unit cell from the terminal "P1" is defined as "50", and the cost value of the third unit cell and the later is all defined as "10", similarly to the other unit cells. As the wiring "L2" in the area as shown in the figure is distant from the terminal, each cost value of the unit cells through which the wiring "L2" is going, is all "10". Although it is not illustrated here, it is needless to say that the like cost value is set in the vicinity of the other terminal connected by the wiring, on the other end of the wiring "L1" and on the both ends of the wiring "L2", in the similarly gradient way.

FIG. 3(B) shows the state in which the processing of Steps 206 and 207 has been performed by the peeling and rewiring unit 13 after each cost value was set like FIG. 3(A). As the cost value of the unit cell in the vicinity of the terminal "P1" is large, the wiring route "L3" is established deviated from the wiring "L1". Therefore, the wiring "L2" is peeled off as shown, because the wiring is carried out along the wiring route "L3".

FIGS. 4(A) and (B) show the way to decide which part of the wiring to be peeled off when peeling off another wiring so as to do the wiring processing.

With respect to the terminal "P2" of FIG. 4(A), each cost value is set on the unit cells through which the wiring "L4" is going, as "100, 50, 10, 10, . . . " in this order from the unit cell nearest to the terminal "P2", similarly to the case of FIG. 3(A).

FIG. 4(B) shows the state in which the processing of Steps 206 and 207 has been performed by the peeling and rewiring unit 13 after each cost value was set like FIG. 3(A). Since the cost value of the unit cell adjacent to the terminal "P2" and the second unit cell therefrom is large in this case, the wiring route "L5" is established deviated from these unit cells. Accordingly, the wiring "L4" is peeled off from the position of the second unit cell from the terminal "P2" as illustrated, in order to carry out the wiring along the wiring route "L5".

As mentioned above, according to this embodiment, the wiring is never peeled off in the vicinity of the terminal even in case of performing the wiring processing while peeling off another wiring, because of the larger cost value being set on the unit cell in the vicinity of the terminal. This can prevent from the situation such as to make it impossible to draw wiring from a terminal in case of performing the rewiring processing on the terminal where the wiring is peeled off.

Figure 13:
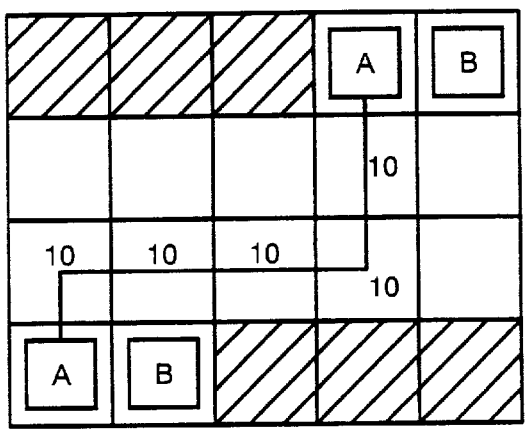
FIG. 13 shows a layout for use in describing further another example of the conventional setting way of a cost value and wiring processing.
Figure 13:
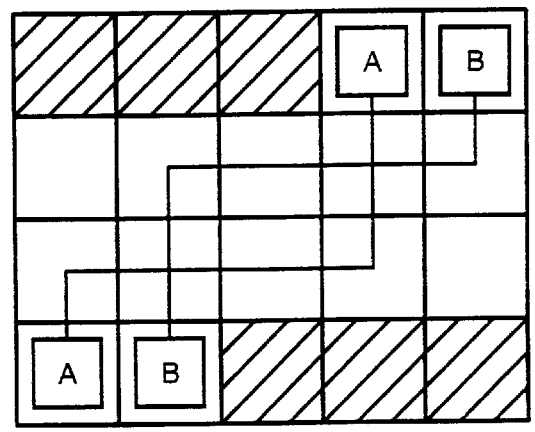
Figure 13:
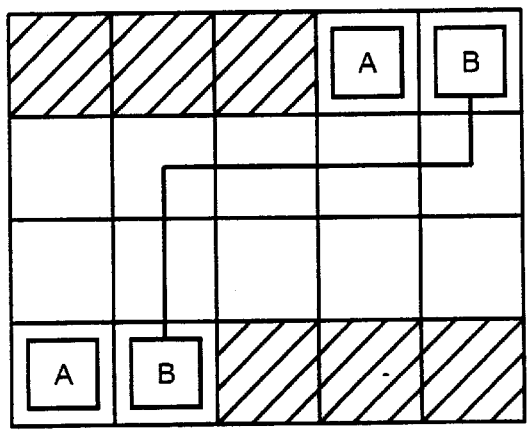
Figure 13:
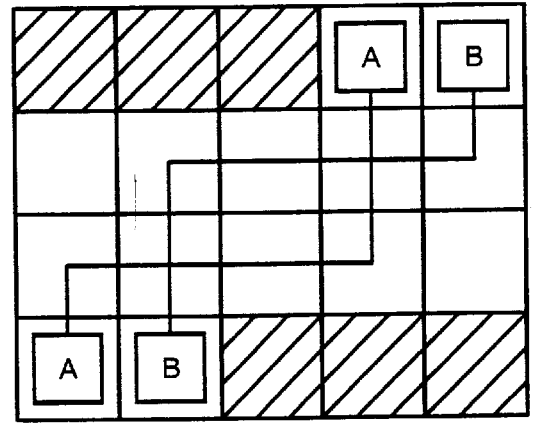

This time, an operation of this embodiment will be described in the case where the process circulates like a loop between the step of obtaining wiring by a predetermined wiring processing and the step of peeling off another connected wiring by the same wiring processing, as described in the conventional technique referring to FIG. 13.

On the coordinate plane surface for wiring arrangement as shown in FIG. 5, when the terminal pair "A, A" is connected with each other in the initial wiring processing as shown in FIG. 5(A), the wiring route "B-B" for connecting the unconnected terminal pair "B, B" is established like FIG. 5(B), deviated from the unit cells having the cost value "100" adjacent to the terminals "A". Accordingly, the wiring "A-A" is peeled off as shown in FIG. 5(C), owing to the wiring processing along the wiring route "B-B". Next, when a wiring route for connecting the terminal pair "A, A" getting into unconnected state because of the wiring "A-A" being peeled off, is searched for, while avoiding the unit cells having the large cost value in the vicinity of the terminals "B", it is established as shown in FIG. 5(D), so to carry out the wiring processing along the wiring route "A-A", thereby completing the wiring processing for the terminal pairs "A, A" and "B, B".

As mentioned above, this embodiment can prevent from the situation such as to make it impossible to draw wiring from the terminals in case of performing the rewiring processing on the terminals whose wiring has been peeled off, by peeling off the wiring at the position distant from the terminals. Therefore, according to the embodiment, a wiring route in accordance with the design rule can be obtained, even in case of the layout that the wiring processing couldn't be completed, circulating like a loop between the step of obtaining wiring by a certain wiring processing and the step of peeling off another connected wiring by the same wiring processing in the conventional art.

This time, an automatic wiring method will be described, according to another embodiment of the present invention.

Figure 6:
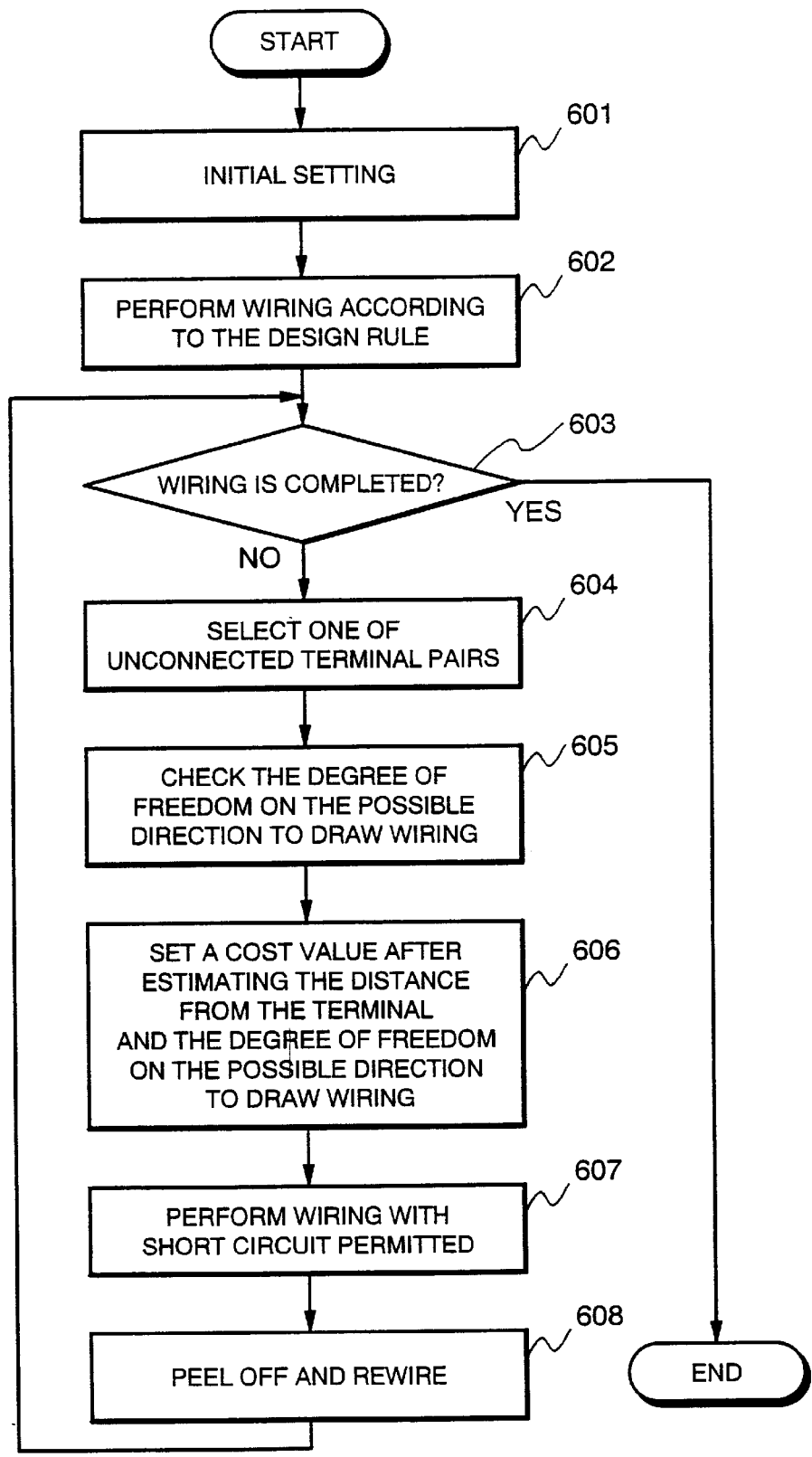
FIG. 6 is a flow chart showing an operation of an automatic wiring method according to another embodiment of the present invention.
Figure 7:
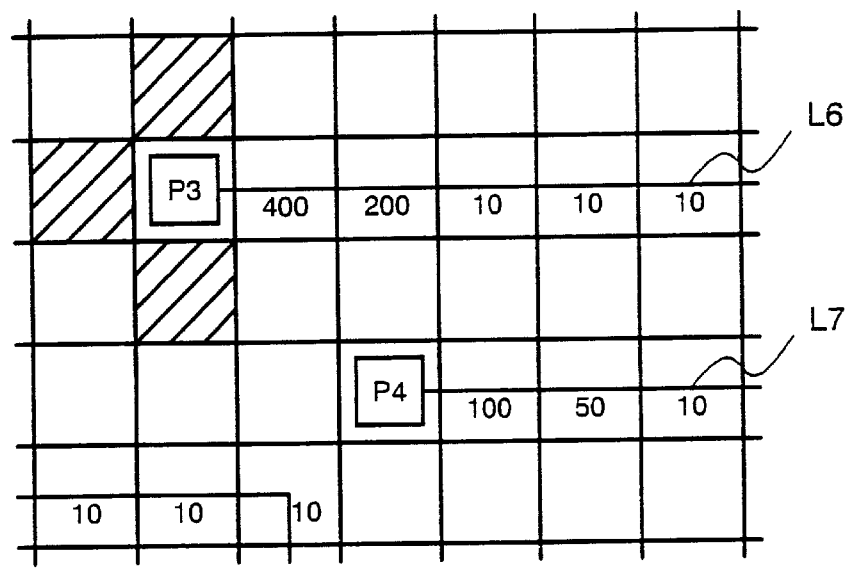
FIG. 7 shows a layout for use in describing an example of the wiring process according to the embodiment.
Figure 8:
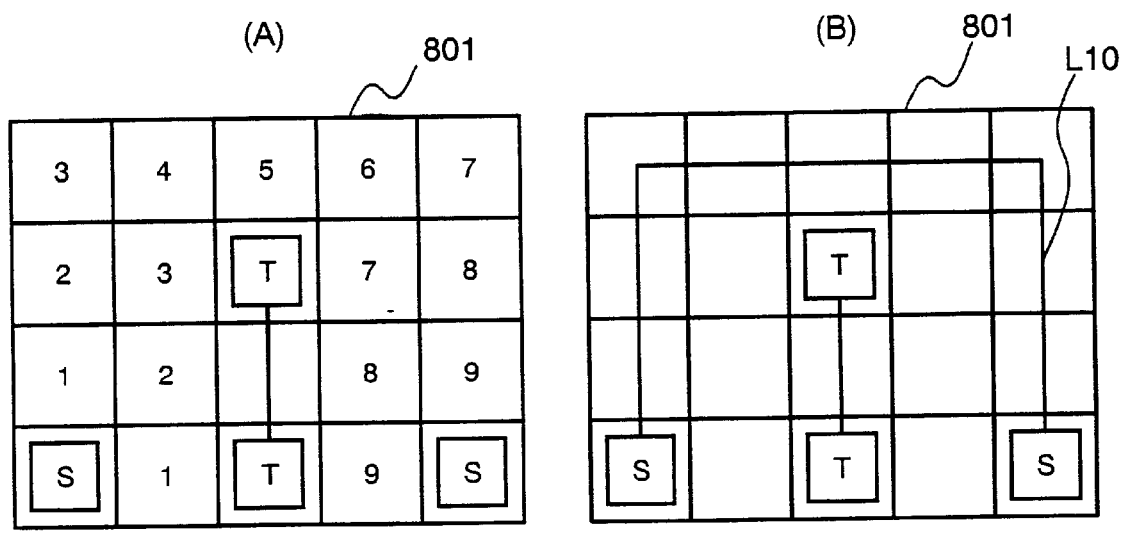
FIG. 8 shows a layout for use in describing how to search for a wiring route by the cost-attached labyrinth method.
Figure 9:
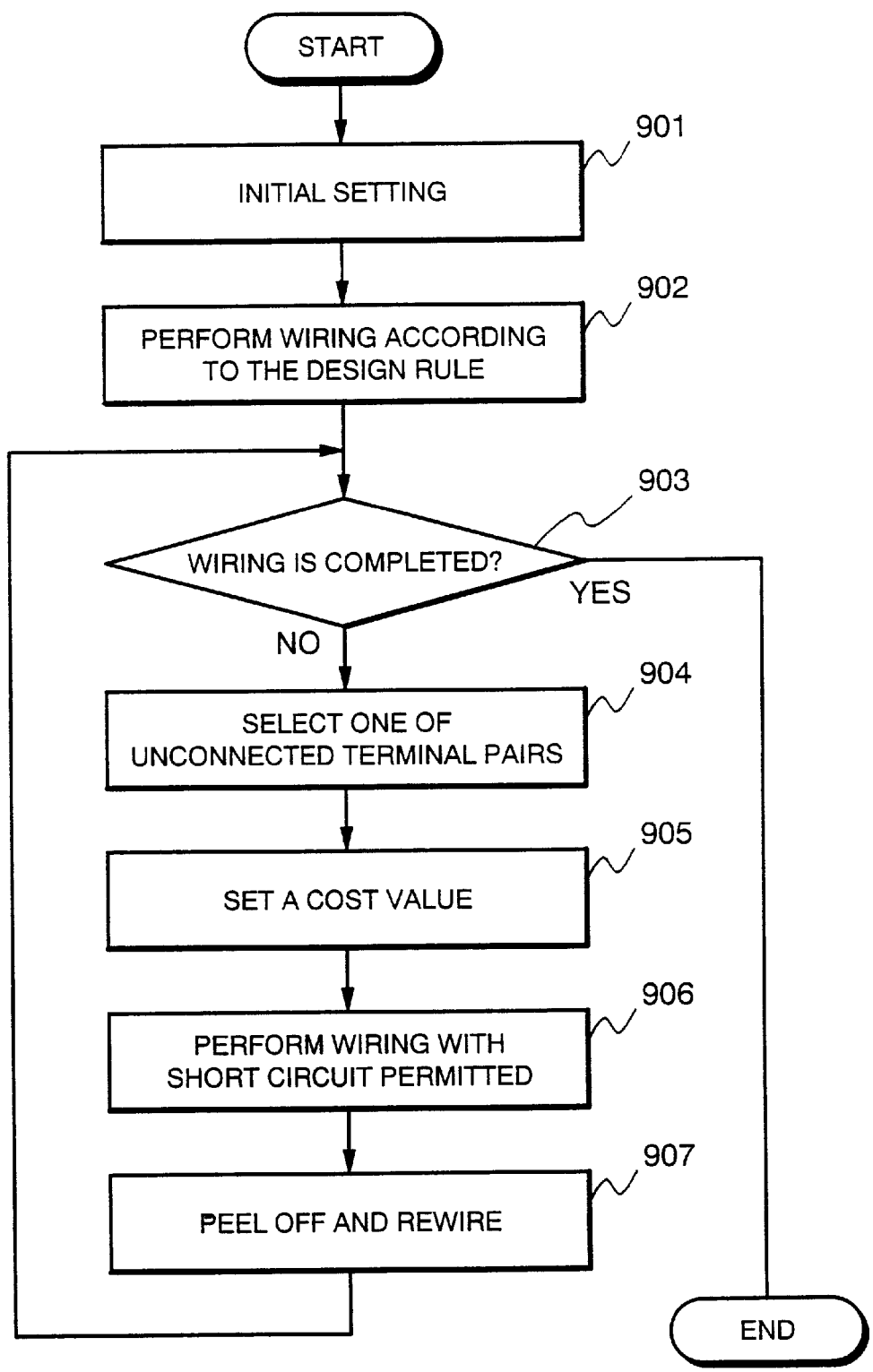
FIG. 9 is a flow chart showing an operation of the conventional automatic wiring method.
Figure 10:
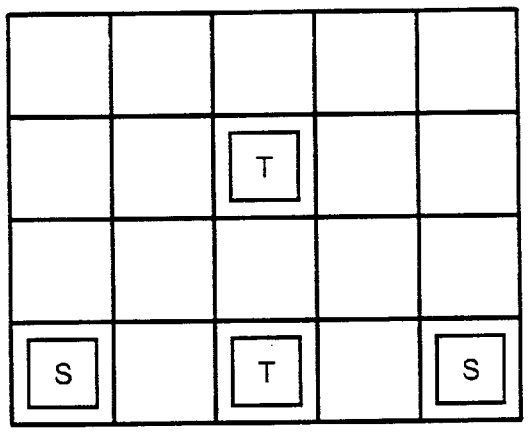
FIG. 10 shows a layout for use in describing an example of the wiring process according to the conventional automatic wiring method.
Figure 10:
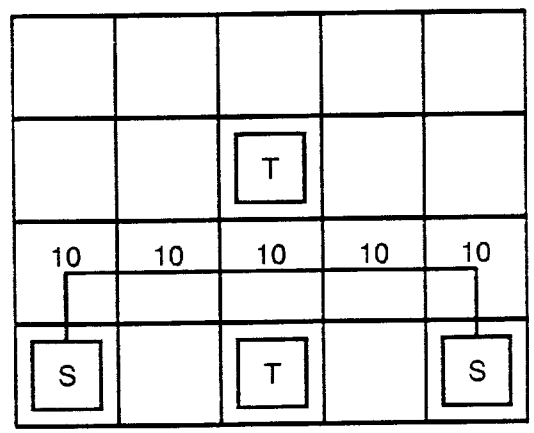
Figure 10:
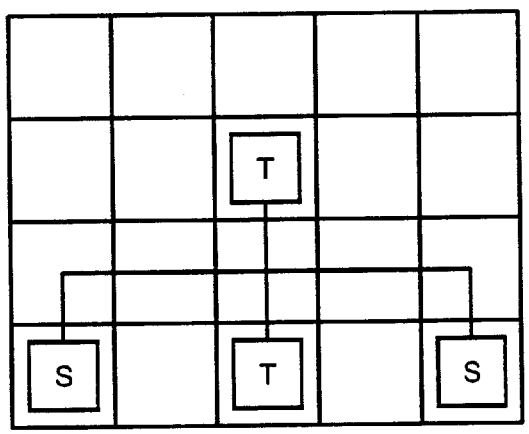
Figure 10:
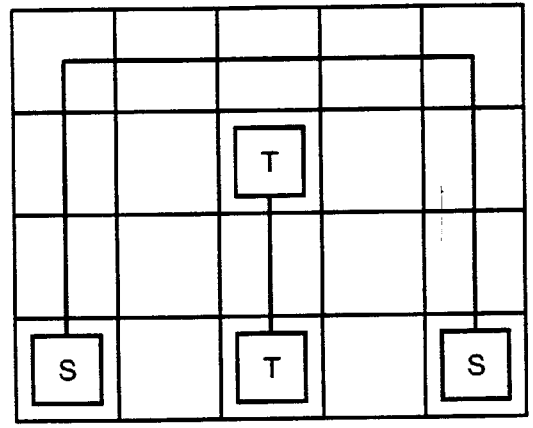
Figure 11:
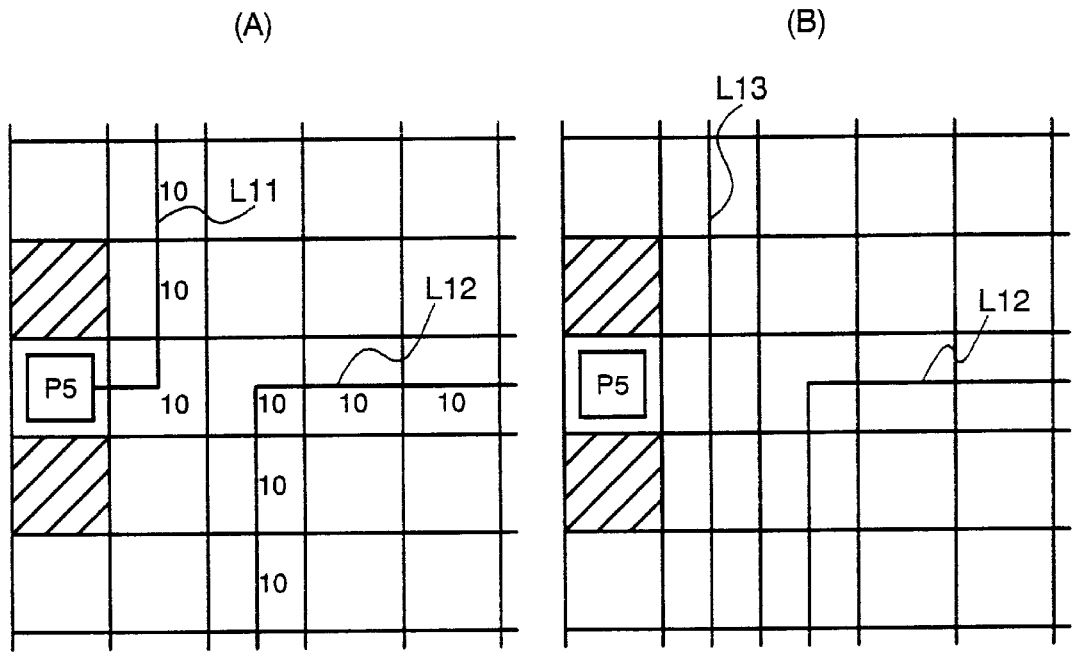
FIG. 11 shows a layout for use in describing an example of the conventional setting way of a cost value and wiring processing.
Figure 12:
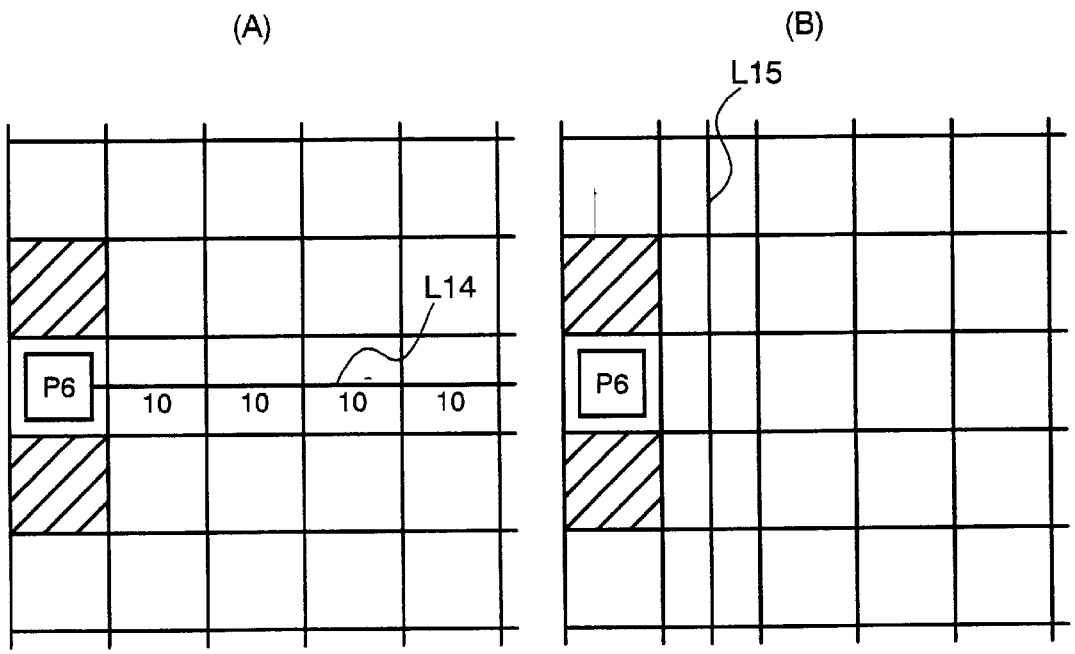
FIG. 12 shows a layout for use in describing another example of the conventional setting way of a cost value and wiring processing.

FIG. 6 is a flow chart showing an operation according to the automatic wiring method of the embodiment. FIG. 7 shows a layout for use in describing the wiring process of searching for a wiring route to be connected, so to establish the wiring route, according to the embodiment. The automatic wiring device for realizing the automatic wiring method of the embodiment has the same structure as the automatic wiring device of the first embodiment as shown in FIG. 1.

The short cost value setting unit of this embodiment operates substantially in the same way as the short cost value setting unit 12 as shown in FIG. 1. However, when a cost value is set on each unit cell through which the connected wiring is going, a method of deciding the cost value depending on the degree of freedom such as to draw wiring from a terminal where the wiring processing has been completed is adopted in addition to the method of deciding the cost value depending on the distance from the terminal. Namely, the larger the degree of freedom on the terminal is, the smaller the cost value is set on the relevant unit cell, and the smaller the degree of freedom on the terminal is, the larger the cost value is set on the relevant unit cell. When drawing wiring from a given terminal, as the possible direction to draw wiring from a terminal is four direction at the maximum, the cost value is set minimum on the unit cell associated with such a terminal capable of extending wiring all around the four direction. According as the number of the possible direction to draw wiring from a terminal is decreased, the cost value relative to the terminal is increased. In case of the terminal having only one possible direction, the cost value is set maximum. Accordingly, when a wiring route is passing in the vicinity of a terminal where the possible direction to draw wiring is restricted, because of being adjacent to the wiring prohibited area, another terminal, or another wiring, the accumulated cost value thereof is much larger.

Next, an operation of this embodiment will be described with reference to the flow chart of FIG. 6 and the layout view of FIG. 7.

As shown in the flow chart of FIG. 6, the operation from Step 601 to Step 604 is the same as the operation from Step 201 to Step 204 in the first embodiment as shown in FIG. 2.

Selecting a terminal pair to be processed, the short cost value setting unit 12 checks the degree of freedom on the possible direction to draw wiring from the terminal, as for each terminal where the wiring processing has been already completed (Step 605). The unit 12 sets a cost value on each unit cell on the coordinate plane surface for wiring arrangement (Step 606), according to the degree of freedom on the possible direction to draw wiring obtained for every terminal in Step 605 and the priority attachment rule for deciding a cost value depending on the distance from a terminal. Here, the cost value of the unit cell adjacent to the terminal is defined as "100", and the cost value of the second unit cell from the terminal is defined as "50" in the same way as the first embodiment. If the degree of freedom to draw wiring is decreased by 1, the cost value is increased twice, if the degree of freedom is decreased by 2, the cost value is three times more than ever, and if the degree of freedom is decreased by 3, the cost value is four times more than ever. The cost values of the other unit cells are uniformly defined as "10".

The detailed description will be made with reference to the layout view of FIG. 7. As for the terminal "P3" having only one possible direction to draw wiring because of being surrounded by the wiring prohibited area (oblique lines) in three direction, the cost value of the unit cell adjacent to the terminal "P3" is defined as "400", and the cost value of the second unit cell is defined as "200". While, as for the terminal "P4" capable of extending wiring all around in four direction, the cost value of the unit cell adjacent to the terminal "P4" is defined as "100", and the cost value of the second unit cell from the terminal "P4" is defined as "50". Apparently, the cost value of the unit cell adjacent to the terminal "P3" having only one direction in the degree of freedom to draw wiring is four times as large as the cost value of the unit cell adjacent to the terminal "P4" capable of extending wiring all around in four direction. Therefore, when the peeling and rewiring unit 13 decides a wiring route, there is little possibility of selecting a wiring route going through the vicinity of the terminal "P3".

The wiring processing in Steps 607 and 608 as shown in FIG. 6 is the same as that in Steps 206 and 207 of the first embodiment as shown in FIG. 2.

As set forth hereinabove, the automatic wiring device and automatic wiring method of the present invention makes it possible to prevent a wiring route from passing through the vicinity of a terminal where the wiring processing has been already completed, when searching for the wiring route for a terminal pair remaining unconnected in the initial wiring processing, regardless of shorting another wiring. Therefore, also in case of the rewiring processing after peeling off the shorted wiring route, the present invention makes it possible to decrease the case of failing in the wiring because of complication in the vicinity of the terminal, thereby to improve the efficiency in the automatic wiring.

Thanks to the decrease of the failing case in the wiring because of complication in the vicinity of the terminal, the situation can be prevented, that the wiring processing according to the design rule cannot be performed because of its circulating like a loop between the step of obtaining wiring by a given wiring processing and the step of peeling off another wiring by the same wiring processing.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. An automatic wiring method for performing wiring processing between terminals that are circuit elements, according to the pattern on a coordinate plane surface for wiring arrangement with the circuit elements arranged thereon, in the wiring processing of a pattern design on an integrated circuit or a printed wiring board, comprising the steps of:

first, performing initial wiring processing, on the coordinate plane surface for wiring arrangement to be processed, without permitting any wiring to be shorted;

second, when there remains a terminal pair unconnected in the wiring processing by said first step, setting a cost value on every unit cell including the unit cells through which a connected wiring is going, excepting the unit cells on a given wiring prohibited area, of all the unit cells set on the coordinate plane surface for wiring arrangement, according to a predetermined rule that the cost value of the unit cell on the connected wiring in the vicinity of the terminals of the connected wiring is set larger than the cost values of any other unit cells; and third, deciding a wiring route by the cost-attached labyrinth method, using the cost values set by said second step, so as to perform wiring processing along the wiring route while peeling off another wiring in case of necessity, and if peeling off another wiring in the above wiring processing, performing rewiring processing for connecting a terminal pair getting unconnected owing to the wiring being peeled off;

said second step of setting a cost value on each unit cell including the steps of:

setting a cost value on each unit cell on a connected wiring in such a way that the largest cost value is set on the unit cell adjacent to a terminal of the connected wiring and that the cost value of the unit cell becomes smaller according as the unit cell is further away from the terminal, and setting on the other unit cells, the minimum of the cost values set on the above unit cells on the connected wiring or the smaller cost value.

2. An automatic wiring method as set forth in claim 1, wherein said second step of setting a cost value on each unit cell including a step of setting a cost value on each unit cell on a connected wiring in such a way that the largest cost value is set on the unit cell adjacent to a terminal of the connected wiring and that the cost value of the unit cell becomes smaller according as the unit cell is further away from the terminal, and setting on the other unit cells, the minimum of the cost values set on the above unit cells on the connected wiring or the smaller cost value, and a step of, when the degree of freedom on the possible direction to draw wiring from the terminal is restricted, multiplying the cost value of each unit cell on the connected wiring by a predetermined number so as to make the cost value larger according as the restriction becomes severer.

3. An automatic wiring method as set forth in claim 1, wherein said third step of peeling off another wiring so to perform wiring processing including a step of accumulating each cost value set by said second step, as for each unit cell existing on a route from one terminal to the other terminal of a terminal pair to be connected, and when there exist a plurality of routes, deciding a route having the minimum accumulated value as a wiring route for the terminal pair, by comparison among the accumulated cost value of each route, a step of carrying out wiring processing along the wiring route decided above, while peeling off another wiring that would be shorted by the wiring route, in the wiring processing, and a step of, as for a terminal pair getting unconnected by the wiring being peeled off, performing rewiring processing along the wiring route, as far as there exists a wiring route capable of detouring all the obstacles.

4. An automatic wiring method as set forth in claim 1, wherein said second step of setting a cost value on each unit cell including a step of setting a cost value on each unit cell on a connected wiring in such a way that the largest cost value is set on the unit cell adjacent to a terminal of the connected wiring and that the cost value of the unit cell becomes smaller according as the unit cell is further away from the terminal, and setting on the other unit cells, the minimum of the cost values set on the above unit cells on the connected wiring or the smaller cost value, and a step of, when the degree of freedom on the possible direction to draw wiring from the terminal is restricted, multiplying the cost value of each unit cell on the connected wiring by a predetermined number so as to make the cost value larger according as the restriction becomes severer, while said third step of peeling off another wiring so to perform wiring processing including a step of accumulating each cost value set by said second step, as for each unit cell existing on a route from one terminal to the other terminal of a terminal pair to be connected, and when there exist a plurality of routes, deciding a route having the minimum accumulated value as a wiring route for the terminal pair, by comparison among the accumulated cost value of each route, a step of carrying out wiring processing along the wiring route decided above, while peeling off another wiring that would be shorted by the wiring route, in the wiring processing, and a step of, as for a terminal pair getting unconnected by the wiring being peeled off, performing rewiring processing along the wiring route, as far as there exists a wiring route capable of detouring all the obstacles.

5. An automatic wiring device for use in a pattern design of an integrated circuit or a printed wiring board, for performing wiring processing between terminals that are circuit elements, according to the pattern on a coordinate plane surface for wiring arrangement with the circuit elements arranged thereon, comprising:

an initial wiring means for performing initial wiring processing, on said coordinate plane surface for wiring arrangement to be processed, without permitting any wiring to be shorted;

a short cost value setting means for setting a cost value on each unit cell arranged on said coordinate plane surface for wiring arrangement, on the basis of a predetermined rule, when there remains a terminal pair unconnected in the wiring processing by said initial wiring means;

a peeling and rewiring means for deciding a wiring route by the cost-attached labyrinth method, using the cost values set by said short cost value setting means, so as to perform wiring processing along the wiring route while peeling off another wiring in case of necessity, and if peeling off another wiring in the above wiring processing, performing rewiring processing for connecting a terminal pair getting unconnected owing to the wiring being peeled off;

wherein said short cost value setting means sets a cost value on every unit cell including the unit cells through which a connected wiring is going, excepting the unit cells on a given wiring prohibited area, in such a way that the cost value of the unit cell on the connected wiring in the vicinity of the terminals of the connected wiring is set larger than the cost values of any other unit cells, wherein said short cost setting means:

sets a cost value on each unit cell on a connected wiring in such a way that the largest cost value is set on the unit cell adjacent to a terminal of the connected wiring and that the cost value of the unit cell becomes smaller according as the unit cell is further away from the terminal, and sets on the other unit cells, the minimum of the cost values set on the above unit cells on the connected wiring or the smaller cost value.

6. An automatic wiring device as set forth in claim 5, wherein said short cost setting means further sets a cost value on each unit cell on a connected wiring in such a way that the gradient between the cost values of the unit cells becomes sharper according as the unit cell is nearer to the terminal.

7. An automatic wiring device as set for the in claim 5, wherein said short cost setting means further sets a cost value on each unit cell on a connected wiring in such a way that when the degree of freedom on the possible direction to draw wiring from the terminal is restricted, multiplies the cost value of each unit cell on the connected wiring by a predetermined number so as to make the cost value larger according as the restriction becomes more severe.

8. An automatic wiring device as set forth in claim 5, wherein said short cost setting means sets a cost value on each unit cell on a connected wiring in such a way that the largest cost value is set on the unit cell adjacent to a terminal of the connected wiring and that the cost value of the unit cell becomes smaller according as the unit cell is further away from the terminal, when the degree of freedom on the possible direction to draw wiring from the terminal is restricted, multiplies the cost value of each unit cell on the connected wiring by the number of "1" larger than the restricted number from all originally possible direction to draw wiring, and sets on the other unit cells, the minimum of the cost values set on the above unit cells on the connected wiring or the smaller cost value.

9. An automatic wiring device as set forth in claim 5, wherein said peeling and rewiring means accumulates each cost value set by said short cost value setting means, as for each unit cell existing on a route from one terminal to the other terminal of a terminal pair to be connected, and when there exist a plurality of routes, decides a route having the minimum accumulated value as a wiring route for the terminal pair, by comparison among the accumulated cost value of each route, carries out wiring processing along the wiring route decided above, while peeling off another wiring that would be shorted by the wiring route, in the wiring processing, and as for a terminal pair getting unconnected by the wiring being peeled off, performs rewiring processing along the wiring route, as far as there exists a wiring route capable of detouring all the obstacles.

10. A COMPUTER READABLE MEMORY storing a computer program controlling an automatic wiring device realized by a computer system, for use in a pattern design of an integrated circuit or a printed wiring board, for performing wiring processing between terminals that are circuit elements according to the pattern on a coordinate plane surface for wiring arrangement with the circuit elements arranged thereon, said computer program comprising:

a first step of performing initial wiring processing, on the coordinate plane surface for wiring arrangement to be processed, without permitting any wiring to be shorted;

a second step of, when there remains a terminal pair unconnected in the wiring processing by said first step, setting a cost value on every unit cell including the unit cells through which a connected wiring is going, excepting the unit cells on a given wiring prohibited area, of all the unit cells set on the coordinate plane surface for wiring arrangement, according to a predetermined rule that the cost value of the unit cell on the connected wiring in the vicinity of the terminals of the connected wiring is set larger than the cost values of any other unit cells; and a third step of deciding a wiring route by the cost-attached labyrinth method, using the cost value set by said second step, so as to perform wiring processing along the wiring route while peeling off another wiring in case of necessity, and if peeling off another wiring in the above wiring processing, performing rewiring processing for connecting a terminal pair getting unconnected owing to the wiring being peeled off;

said second step of setting a cost value on each unit cell including a step of setting a cost value on each unit cell on a connected wiring in such a way that the largest cost value is set on the unit cell adjacent to a terminal of the connected wiring and that the cost value of the unit cell becomes smaller according as the unit cell is further away from the terminal, and setting on the other unit cells, the minimum of the cost values set on the above unit cells on the connected wiring or the smaller cost value.

11. A COMPUTER READABLE MEMORY as set forth in claim 10, wherein said second step of setting a cost value on each unit cell including a step of setting a cost value on each unit cell on a connected wiring in such a way that the largest cost value is set on the unit cell adjacent to a terminal of the connected wiring and that the cost value of the unit cell becomes smaller according as the unit cell is further away from the terminal, and setting on the other unit cells, the minimum of the cost values set on the above unit cells on the connected wiring or the smaller cost value, and a step of, when the degree of freedom on the possible direction to draw wiring from the terminal is restricted, multiplying the cost value of each unit cell on the connected wiring by a predetermined number so as to make the cost value larger according as the restriction becomes severer.

12. A COMPUTER READABLE MEMORY as set forth in claim 10, wherein said third step of peeling off another wiring so to perform wiring processing including a step of accumulating each cost value set by said second step, as for each unit cell existing on a route from one terminal to the other terminal of a terminal pair to be connected, and when there exist a plurality of routes, deciding a route having the minimum accumulated value as a wiring route for the terminal pair, by comparison among the accumulated cost value of each route, a step of carrying out wiring processing along the wiring route decided above, while peeling off another wiring that would be shorted by the wiring route, in the wiring processing, and a step of, as for a terminal pair getting unconnected by the wiring being peeled off, performing rewiring processing along the wiring route, as far as there exists a wiring route capable of detouring all the obstacles.

13. A COMPUTER READABLE MEMORY as set forth in claim 10, wherein said second step of setting a cost value on each unit cell including a step of setting a cost value on each unit cell on a connected wiring in such a way that the largest cost value is set on the unit cell adjacent to a terminal of the connected wiring and that the cost value of the unit cell becomes smaller according as the unit cell is further away from the terminal, and setting on the other unit cells, the minimum of the cost values set on the above unit cells on the connected wiring or the smaller cost value, and a step of, when the degree of freedom on the possible direction to draw wiring from the terminal is restricted, multiplying the cost value of each unit cell on the connected wiring by a predetermined number so as to make the cost value larger according as the restriction becomes severer, while said third step of peeling off another wiring so to perform wiring processing including a step of accumulating each cost value set by said second step, as for each unit cell existing on a route from one terminal to the other terminal of a terminal pair to be connected, and when there exist a plurality of routes, deciding a route having the minimum accumulated value as a wiring route for the terminal pair, by comparison among the accumulated cost value of each route, a step of carrying out wiring processing along the wiring route decided above, while peeling off another wiring that would be shorted by the wiring route, in the wiring processing, and a step of, as for a terminal pair getting unconnected by the wiring being peeled off, performing rewiring processing along the wiring route, as far as there exists a wiring route capable of detouring all the obstacles.

* * * * *